United States Patent [19]

Nguyen

[11] Patent Number: 4,808,274

[45] Date of Patent: Feb. 28, 1989

[54] METALLIZED SUBSTRATES AND PROCESS FOR PRODUCING

[75] Inventor: Pascaline H. Nguyen, Marlboro, N.J.

[73] Assignee: Engelhard Corporation, Menlo Park, N.J.

[21] Appl. No.: 906,345

[22] Filed: Sep. 10, 1986

[51] Int. Cl.⁴ ............................................. C25D 5/02
[52] U.S. Cl. ..................................... 204/15; 204/38.4
[58] Field of Search ................................. 204/15, 38.4

[56] References Cited

U.S. PATENT DOCUMENTS 4,303,480 12/1981 Wood .................................... 204/15

*Primary Examiner*—T. M. Tufariello

[57] ABSTRACT

The present invention is directed to metallized substrates and particularly metallized substrates for use in microwave integrated circuits and a process for producing such substrates. The metallized substrates generally comprise a dielectric substrate on which is formed a pattern such as a conductor line pattern, the pattern being formed of a conductive metal. The metallization is accomplished by forming one or more adhesion layers from a metallo organic composition which is built up with a metal conductor.

19 Claims, 5 Drawing Sheets

METALLIZED SUBSTRATES AND PROCESS FOR PRODUCING

BACKGROUND OF THE INVENTION

I. Field of Invention

The present invention relates to metallized substrates and particularly microwave integrated circuit (MIC) substrates for use in hybrid microwave integrated circuits and a process for making the same.

II. Description of the Prior Art

Microwave integrated circuit technology has recently come to the forefront as a highly reproducible low cost microwave fabrication technique. With the continued and growing use of microwave technology for military applications and recently in the consumer markets, there is a need for low cost microwave integrated circuits. Moreover, there is a need for low cost metallized substrates for non-microwave devices such as multilayer integrated circuits and various other hybrid circuits.

The current technologies used to manufacture microwave integrated circuits are derived from conventional low frequency manufacturing techniques. Microwave integrated circuits can be produced in either the hybrid or monolithic form. In hybrid circuits, active devices are attached to a substrate from which passive circuitry is formed. In monolithic circuits both passive and active devices are formed in situ. The increased use of hybrid microwave integrated circuits stems mainly from the fabrication of reliable microwave semiconductor components which allow the manufacture of a large range of microwave devices. The active components are incorporated in circuits consisting of passive elements which may be in discrete or distributed form. The majority of hybrid microwave integrated circuits are fabricated with distributed elements.

Presently, two technologies, the thick film technology and the thin film technology, predominate the manufacture of metallized substrates including hybrid MIC substrates. The thin film technology involves the forming of a metallized substrates by first sputtering an adhesion promoting layer such as a titanium-tungsten alloy onto a substrate such as an alumina material. Then, a conductive layer such as a layer of gold is sputtered onto the adhesion promoting layer. Finally, a pattern is formed on the substrate by means of photoresist and etching techniques. While the thin film technology can produce a metallized substrate with excellent line resolutions, it has a number of disadvantages. One of the major disadvantages is the waste of materials. Thus, in order to produce a metallized substrate, a large amount of material must be used, but only a fraction is actually deposited onto the substrate. The remainder of the sputtered material coats the walls of the vacuum chamber.

A further disadvantage of the thin film technology is that the substrates are made in a batch process. This can be a problem since one cannot be sure of the quality of the metallization until the entire batch is finished.

*IEEE Journal of Solid State Circuits*, Vol. Sc-5, No. 6, December 1970, "Microwave Integrated-Circuit Technology-A Surrey", Caulton, pp. 292-303. and IEEE Transactions On Parts, Hybrid, and Packaging, Vol. PHP-10, No. 2, June 1974, Foster et al, "Thick Film Techniques for Microwave Integrated Circuits" pp. 88-94 describe thin film techniques for manufacturing metallized substrates and particularly an MIC substrate in great detail and discuss its disadvantages.

The thick film technology offers an alternative to thin film technology. A metallized substrate, for example, an MIC substrate is manufactured by the thick film process by screen printing a thick film conductor composition such as a thick film gold. Generally, the thick film composition will have a glass frit base. While the thick film process is less costly than the thin film process, it too has its disadvantages.

The primary disadvantage of the thick film process is that it can only produce conductor lines and conductor line patterns with limited accuracy. Consequently, signal losses are high and as a result some devices cannot even be fabricated by this technique. In addition, the thick film technique utilizes glass frit containing pastes. As a result of the presence of the glass frit in the conductive layer, the circuit suffers high frequency losses. This may be due to the fact that glass absorbs the microwaves. In order to overcome this disadvantage, recently, there has been some experimentation with fritless inks. Fritless copper inks have recently been developed for microwave use to overcome the disadvantages of frit containing inks. While these fritless copper inks overcome the disadvantage possessed by the glass frit containing inks, the process for producing substrates with these inks is much more complicated and expensive. Thus, the firing process needs to be modified since a non-oxidizing atmosphere such as nitrogen is required. Copper will, of course, oxidize in a oxygen atmosphere resulting in a non-conductive layer. Other attempts have been made to overcome the disadvantages of the thick film and thin film processes including the use of a metallo organic gold composition to form at least a portion of the metallized conductor line followed by the electroplating of a copper conductor. These attempts, however, have resulted in inferior substrates because of the poor adhesion of the electroplated copper to the metallo organic gold.

The present invention overcomes the disadvantages of the prior art techniques for manufacturing metallized substrates and particularly microwave integrated circuit substrates.

SUMMARY OF THE INVENTION

The present invention is directed to metallized substrates and particularly microwave integrated circuit (MIC) substrates and a process for making the same which overcomes the disadvantages of the prior art. The present invention will be described with reference to MIC substrates. However, it is understood that the process of this invention can be used to manufacture any metallized substrate. The MIC substrate of the present invention is relatively simple and inexpensive to produce as compared to MIC substrates manufactured by the thin film sputtering method. In addition, the MIC substrate of the present invention has excellent line definition resulting in low signal losses as compared to the MIC substrate produced by the thick film technique. Further, the MIC substrate exhibits excellent performance and reliability in view of the excellent adherence of the metal ground plane and conductor line patterns to the dielectric substrate. The advantages of the MIC substrate of the present invention result from the use of a metallo organic composition to form an adhesion layer onto which a conductor can be screen printed or electroplated. As a result, costly thin film sputtering techniques are not needed to form the conductor layer. Photo etching techniques can be used to achieve excellent conductor line definition resulting in low signal losses. The result is an MIC substrate which is relatively inexpensive to manufacture and in use exhibits a low signal loss.

According to the present invention, the MIC substrates may be employed in microwave integrated circuits produced using both lumped circuitry and distributed circuitry. MIC substrates produced for use in distributed circuitry may be produced in any suitable form including microstrip, slotted microstrip, slotline, coplanar guide and suspended-substrate transmission line. The microstrip is the most commonly used type of substrate in the manufacture of hybrid microwave integrated circuits because it is a planar open structure which allows for easy attachment of active devices and because it is compatible with conventional fabrication techniques and can provide a range of impedances. Since, the microstrip is the most commonly used substrate, for the purposes of describing the present invention, the manufacture of a microstrip substrate will be disclosed in detail. It is, however, understood that the present invention is not so limited and includes the manufacture of any metallized substrate including MIC substrates wherein a metal conductor is applied to an insulating substrate material.

According to the present invention, a microstrip substrate comprises a dielectric substrate, a conductor line comprising a conductive metal material on the top surface thereof and a ground plane also comprising a conductive metal material on the bottom surface thereof. The dielectric substrate comprises an insulating material such as 99.6 percent polished alumina. Some desirable characteristics of materials for use as the dielectric substrate are low dielectric loss, good adherence of metal conductors, polished surfaces for the prevention of high signal losses, high uniformity of composition and maintenance of mechanical integrity during processing. To form the microstrip substrate a metallo organic composition comprising at least one metal resinate, at least one base metal resinate, at least one film forming resinate and a medium is screen printed or sprayed onto both the top and bottom surfaces of the insulating base material.

As defined herein, a precious metal resinate are those containing metals which primarily act as the conductor in the metal film after curing, whereas base metal resinates are those resinates wherein the metal oxidizes upon curing. The base metal resinates act primarily as adhesion promoters and are necessary for the proper adherence of the conductor layer to the dielectric substrate. The selection of the proper base metal resinates, especially when a conductor is to be electroplated thereon, is important since it has been found that certain base metal resinates such as bismuth, tin and chromium will dissolve in an acid based plating bath thus voiding the metallized layer of its adhesion properties. The film forming resinates are those resinates which promote the formation of a film onto the surface on which the composition is applied.

Metallo organic resinates according to the present invention are compounds comprising a central metal ion linked to ligands, such as organic and inorganic molecules through a hetero atom bridge. The resinates include both naturally ocurring resinates (rosin) and synthetic resinates such as carboxylates, mercaptides and alcoholates.

The layer of metallo-organic material is then dried and heat cured, burning off the organics and leaving a metal film. This metal layer is conductive and acts as an adhesion layer for a conductive layer which is then built onto the adhesion layer. This is accomplished by applying a conductive material onto both the top and bottom surfaces of the substrate by a suitable method including screen printing and electroplating so that the overall thickness of the conductive layer and metallo organic adhesion layer is about $2\mu$ to $40\mu$, and more preferably about $4\mu$ to $16\mu$.

If the conductive layer is formed by screen printing, it is presently preferred to employ a gold paste or ink composition comprising a gold flake or powder in a suitable medium. The conductive layer can also be formed by electroplating either a precious metal conductor such as gold or another conductor material such as copper onto the substrate from an electroplating bath. When electroplating is the mode of applying the metal conductive layer, it is preferred to add another layer of material to the metallo organic adhesion layer to promote adhesion of the electroplated conductor. The added layer of material comprises at least one precious metal conductor resinate such as gold, and at least one film forming resinate such as rhodium. The desired conductor line pattern can then be formed on the top surface of the MIC substrate using conventional photoresist techniques. The bottom surface acts as the ground plane for the microstrip. As will be described in greater detail hereinafter with reference to other embodiments, the conductor line and the ground plane can take different forms and locations on the dielectric substrate depending on the form of substrate, e.g. slotted microstrip, slotline etc.

In another embodiment according to the present invention, the conductor line pattern can be formed by an electroplating technique known as pattern plating. According to this technique, the desired conductor line pattern is formed on the substrate by first applying a photoresist material onto the metallo organic adhesion layer or layers. The photoresist is then exposed to light through a photomask. The exposed portion, which in this case is in the form of a line, is washed away exposing the adhesion layer. The substrate is then electroplated with a conductor. Since a portion of the surface is masked with a non-conductive photoresist material, the conductor will not plate onto those portions of the surface, but only onto the portions not having photoresist thereon, which in this case is a line. Once the conductor is plated up in this manner, the photoresist is stripped away with a conventional solvent and then flash etched leaving the desired conductor line pattern. A negative photoresist technique rather than this positive photoresist technique may be employed.

This process of using a metallo organic organic layer or layers and a conductive layer thereon whether it be applied by screen printing or electroplating may be used to form any type of metallized substrate wherein a conductor is formed on a dielectric substrate. Thus, various conductor line patterns may be formed by the method described herein.

The substrate of the present invention thus overcomes the disadvantages of the prior art by the use of a novel metallo organic adhesion layer or layers. The adhesion layer which is fritless conductive layer thereon without the need for the use of the costly and time consuming thin film sputtering techniques. In view of the fact that a relatively thin layer of material is formed on the dielectric substrate, photoresist techniques can be used to form well-defined lines resulting in low signal losses. This is a distinct advantage over the prior art thick film techniques which rely on screen printing to form relatively thick conductor line patterns which are relatively poorly defined resulting in high signal losses especially at high microwave frequencies such as 10 GHz or above.

DESCRIPTION OF THE PREFERRED EMBODIMENT

Figure 1:
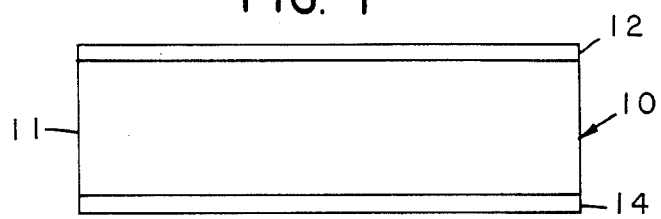
FIGS. 1–3 are sectional views showing the production of a metallized substrate of the present invention by the screen printing technique.

The present invention will now be described in more detail with reference to the accompanying drawings. The same portions in the respective drawings are designated by the same or equivalent reference numerals. While the present invention will be described with reference to an MIC substrate for use in the distributed element approach to the manufacture of microwave integrated circuits and particularly to the microstrip transmission line approach, it should be understood that the substrates manufactured by the process according to the present invention can be used in a variety of non-microwave applications and can be used in other distributed element approaches and in the lumped element approach to the formation of microwave integrated circuits. For the sake of simplicity, the present invention will now be described with reference to a microstrip transmission line.

Figure 3:
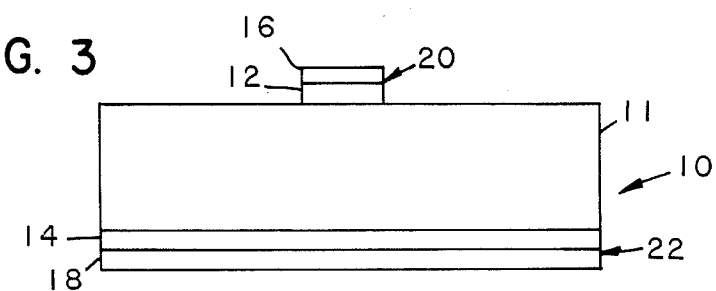
Figure 4:
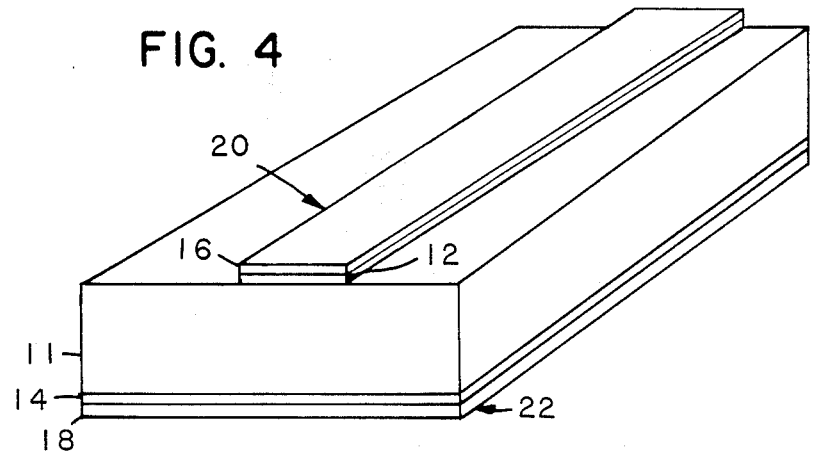
FIG. 4 is a perspective view of the metallized substrate of FIG. 3.
Figure 5:
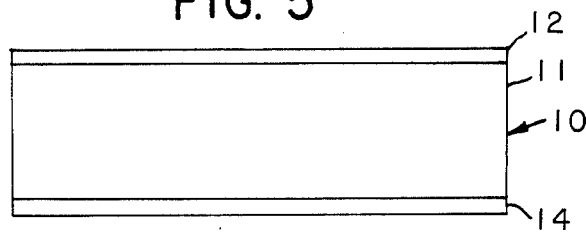
FIGS. 5–8 are sectional views showing the production of the metallized substrate of the present invention by the electroplating technique.
Figure 6:
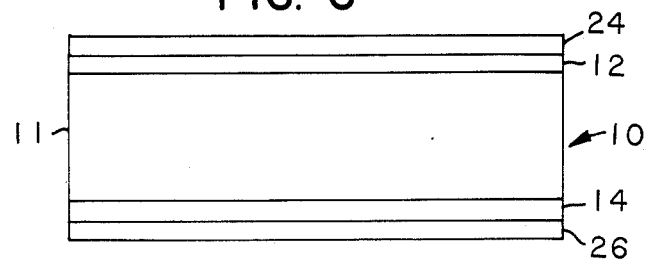
Figure 7:
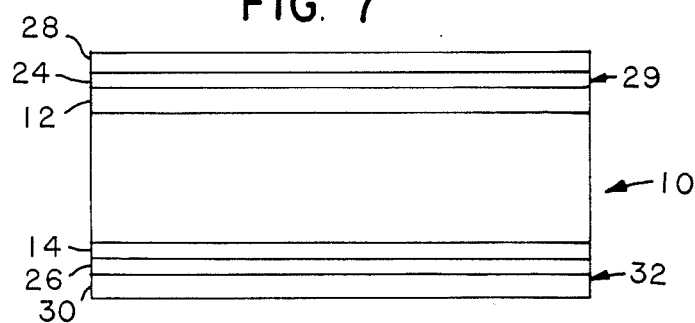
Figure 8:
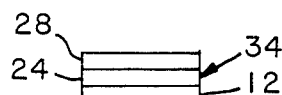

Referring to FIGS. 3 and 4, an MIC substrate according to the present invention is represented by reference numeral 10. It comprises a dielectric substrate 11, a conducting strip 20 and a ground plane 22. The conducting strip 20 comprises adhesion promoting layer 12, which is built up to a desired thickness by depositing a conductive layer 16 thereon. The ground plane 22 comprises an adhesion promoting layer 14, which is built up to a desired thickness by depositing a conductive layer 18 thereon. Layers 12 and 14 in addition to being adhesion promoting are also conductive.

The dielectric substrate 11 may be formed of an inorganic oxide including ceramic based materials such as alumina and mixtures of alumina with other oxides such as boron trioxide, silicon dioxide and lead oxide, the other oxides being present in an amount from about 0.4 to about 8 percent by weight of the dielectric substrate. Various glass materials including silicon dioxide glasses may also be used. Beryllia, porcelanized steel, 99.6 percent as fired and polished alumina, ferrite, Z cut quartz, 7070 glass, fused silica are further examples of materials used to form the dielectric substrate 11. Any suitable insulating material may, however, be used.

According to the process of the present invention and as best shown in FIG. 1, a metallo organic based adhesion promoting layer 12 is formed on the dielectric substrate 11. The layer 12 can be formed on the dielectric substrate 11 by any suitable method including both screen printing and spraying. It is, however, presently preferred to screen print layer 12. The adhesion promoting layer 14 may be also formed at this point in the process. Both layers 12 and 14 are formed from a metallo organic composition. They may either be formed from the same metallo organic composition or from different compositions, although it is presently preferred that they be formed from the same composition for the sake of simplicity of manufacture.

The metallo organic compositions suitable for use in the present invention comprises a precious metal resinate, one or more base metal resinates, at least one film forming resinate and a suitable medium. Metallo organic resinates according to the present invention are compounds comprising a central metal ion linked to ligands, such as organic and inorganic molecules through a hetero atom bridge. The resinates include both naturally ocurring resinates (rosin) and synthetic resinates such as carboxylates have the general formula:

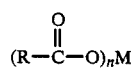

wherein R is a hydrocarbon containing 8 to 20 carbon atoms and $M^{+n}$ is a central metal ion with valence $+n$; alcoholates having the general formula:

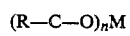

wherein R is a hydrocarbon containing 8 to 20 carbon atoms and $M^{+n}$ is a central metal ion with valence $+n$; metal mercaptides having the formula:

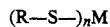

wherein R is a hydrocarbon moiety containing 8 to 16 carbon atoms and M is a central metal ion with valence $+n$; metallo-organic compounds having two different types of ligands having the general formula:

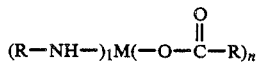

wherein R is a hydrocarbon moiety containing 8 to 16 carbon atoms and M is a central metal ion with valence $+n$; compounds containing aldehyde functional groups having the formula:

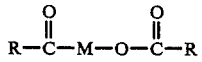

wherein R is a hydrocarbon moiety containing 8 to 16 carbon atoms and M is a central metal ion; and alkoxides having the formula:

wherein R is a hydrocarbon moiety containing 8 to 16 carbon atoms and M is a central metal ion with valence $+n$.

Precious metal resinates which may be used according to the present invention include gold, silver, palladium and platinum resinates and mixtures thereof. Illustrative of such precious metal resinates are gold amine 2-ethylhexoate, t-dodecyl gold mercaptide, gold lavender, silver neodecanoate and palladium neodecanoate. A gold resinate is presently preferred. The precious metal resinate is present in an amount of from about 4 to 25 percent, more preferably in an amount of about 5 to 20 percent, and most preferably in an amount of about 13 percent to 18 percent. These percentages refer to the percent of metal present in the metallo organic resinate composition. When percentages are disclosed hereinafter with reference to the metallo organic resinates, those percentages refer to the percent metal by weight in the composition unless otherwise stated. The film forming resinate is present in an amount of from about 0.01 to 1.0 percent and preferably in an amount of from about 0.02 to 0.5 percent. A rhodium resinate such as rhodium-2-ethylhexoate and firein are examples of a film forming resinate.

The base metal resinates generally are present in an amount of 0.1 to 3 percent, more preferably in an amount of about 0.1 to 2 percent, and most preferably in an amount of about 0.1 percent to 1.0 percent. The base metal resinates are mainly present to promote adhesion. Without the presence of at least one base metal resinate, the metallo organic composition will not adequately adhere to the substrate resulting in a poor quality MIC substrate. Moreover, the conductive layer will not properly adhere to the metallo organic layer. The selection of the type of resinates and their relative proportions depends on the surface onto which the metallo organic composition is to be deposited and also the manner in which the conductive layer is to be applied. If the conductive layer is to be applied by electroplating at least one base metal resinate other than bismuth, tin and chromium should be employed since those metal resinates will dissolve in most acid plating baths. Suitable base metal resinates for use in the metallo organic composition of the present invention include bismuth resinate, vanadium resinate, chromium resinate, tin resinate, silver resinate, silicon resinate, lead resinate, titanium resinate, boron resinate, tungsten resinate, copper resinate, zirconium resinate, aluminum resinate, cadmium resinate, niobium resinate, and antimony resinate.

Illustrative of such base metal resinates are lead 2-ethylhexoate, ethylhexylborate, Al(butoxide)$_3$, Cu(neodecanoate)$_2$, silicon benzoyl/2-ethylhexoate, tetrabutyl titanate, titanium neopentanoate, maganese, zinc, chromium, bismuth and silicon 2-ethylhexoates, vanadium, naphathenoate, titanium isopropylate, tungsten, cyclonol and boron-2-ethylhexanoyl, chromium isopropylate, tin dibutyl neodecanoate, neobiumbutylate, silicon benzylate and chromium methyl sulfide.

The medium which forms the remainder of the metallo organic resinate composition is composed of a suitable solvent, plastisizer and/or thickener to give the metallo organic composition the proper rheology for screen printing and/or spraying. Suitable solvents include terpineol, xylene, toluene, dibutylphthalate, dipentene, cyclohexanone, turpentene based solvents, oils such as Amarys oil and lavender oil and various phthalate esters or mixture thereof. Suitable plastisizers include rosin esters and suitable thickeners include various resins such as ureaformaldehyde alkyd, asphalt gilsonite resin and other hydrocarbon resins or mixtures thereof.

The metallo organic composition is preferably prepared by mixing together the metal resinates. The composition is then heated, preferably on a steam bath, until a thick mixture is formed. This process burns off some of the organic components to a predetermined weight. Then, the medium is added and the resulting composition is roll milled, preferably on a three roll mill, into a paste suitable for screen printing. Other conventional and suitable modes of preparation may be employed. If spraying is the desired mode of application, the paste is diluted with a suitable solvent such as the solvents disclosed above.

The layers 12 and 14 are preferably screen printed to a thickness of from about 0.1 to 0.5$\mu$, preferably of about 0.1 to 0.3$\mu$, although any suitable thickness is acceptable depending on the use of the substrate. Layers 12 and 14 can be screen printed to the same or different thicknesses. It is, presently preferred that they be screen printed to about the same thickness. After the metallo organic composition is formed into layers on the dielectric substrate 11, it is dried and then fired in a box or moving belt furnace. Although, any suitable furnace may be employed. In so doing, the medium and the organic part of the resinates is burned off leaving a metal film. While any suitable drying and heat curing technique may be employed, it is presently preferred to dry the metallo organic composition at about 125° C. for ten minutes and then fire it for one-half hour with a peak temerature of about 850° C. for about 10 minutes. This firing is preferably performed in a moving belt furnace.

Figure 2:
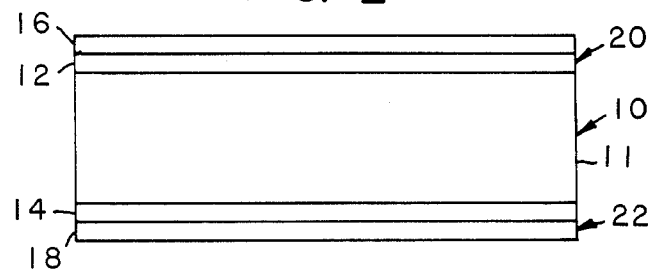

As best shown in FIG. 2, the next step in the process involves the building up of layers 12 and 14 to the desired thickness by forming conductive layers 20 and 22. While any suitable conductor material can be employed, the specific conductor employed depends on the end use of the MIC substrate and on the method of forming the conductor layer. It is presently preferred to form the conductor layer by either electroplating including pattern plating or by screen printing, Screen printing is the simpliest and most economical method to use. The layers 12 and 14 are built up to an overall thickness of about 2$\mu$ to 40$\mu$, and more preferably about 4$\mu$ to 16$\mu$. Other thickness may be suitable upon the ultimate use of the metallized substrate.

If screen printing is the method used to form the conductive layer, it is presently preferred to employ a gold paste or ink composition of suitable rheology such as Engelhard A1644 for screen printing. Although, other conductor materials such as silver, platinum, palladium or mixtures thereof may be employed. The composition generally comprise 30 to 90 percent conductor material and about 10 to 70 percent medium; more preferably 30 to 80 percent conductor material and 20 to 70 percent medium.

Suitable mediums include the mediums disclosed above for use in forming the metallo organic composition. The conductive layers 20 and 22 are screen printed onto layers 12 and 14 dried and fired. It is presently preferred to dry the screen printed material in an oven at 125° C. for about 20 minutes and then fire it for one-half hour with a peak temperature of 850° C. for 10 minutes. The firing is preferably performed in a moving belt furnace similar to the furnace used to cure the metallo organic based layers 12 and 14.

Then, as best shown in FIG. 3, a conducting line 20 is formed on the top surface of the MIC substrate by means of conventional photoresist and etching techniques. For example, a conducting line may be formed by means of a positive working photoresist and etching technique. According to this technique, a conventional photoresist material such as AZ-4901 or AZ-4902 manufactured by American Hoechst is applied to the surface of layer 16 in FIG. 2. The photoresist layer is then selectively exposed to light through a photomask, which is not shown, so as to define the desired pattern and, then the exposed photoresist material is selectively dissolved away with a developer such as AZ-400K manufactured by American Hoechst to leave the desired pattern. In this particular case, the pattern is in the form of conducting line 20. A negative photoresist technique may also be used. According to that technique, a conventional photoresist material is applied to the surface of layer 16. The photoresist layer is then selectively exposed to light through a photomask so as to define the desired pattern and the unexposed material is selectively dissolved away to leave the desired pattern. Again, in this case, the pattern is in the form of conducting line 20. See FIGS. 3 and 4. Any conventional photoresist technique may, however, be employed. As shown in the drawings, the ground plane 22 composed of layers 14 and 18 remains the same as it appears in FIG. 2.

According to another embodiment of the present invention and as best shown in FIGS. 5-8, layers 12 and 14 may be built up by electroplating thereon. This is accomplished by first forming layers 12 and 14 as described above in connection with FIGS. 1-4. Although not absolutely required, it is presently preferred to add adhesion promoting layers 24 and 26. These layers provide for better adhesion of the electroplated layer to be added thereto. The material used to form layers 24 and 26 is a metallo organic composition differing from the metallo organic composition used to form layers 12 and 14 in that it does not contain any base metal resinates. It comprises a precious metal resinate, alone or in combination with a metal powder or flake, a film forming resinate and a medium. The medium which is employed is the same medium as used in the metallo organic composition used to form layers 12 and 14 and described previously herein. The precious metal resinate is present generally in an amount of from about 8–50 percent by weight and preferably in an amount of from about 20–40 percent by weight. The film forming resinate is present in an amount of from about 0.01 percent to 2.0 percent and more preferably in an amount from 0.02 to 1.0 percent. A gold resinate such as gold lavender is the presently preferred precious metal resinate. The metal powder or flake may be present in an amount of from about 2-20 present although an suitable amount may be employed. However, other precious metal resinates and mixtures thereof may be employed. Firein (a rhodium resinate) is the presently preferred film forming resinate.

Layers 24 and 26 may be applied by any suitable technique including screen printing and spraying. Screen printing is the presently preferred application technique. Layers 24 and 26 are applied to a thickness of about 0.1 to 0.5μ, more preferably about 0.1 to 0.3μ. Once layers 24 and 26 are formed, they are dried and heat cured according to the techniques for drying and heat curing previously described in connection with layers 12 and 14.

Layers 28 and 30 are then formed by conventional electroplating techniques. While any conductive material can be employed, it is presently preferred to electroplate either gold or copper so as to build up layers 12 and 24 and 14 and 26, respectively. Suitable plating baths include cyanide gold plating baths such as Engelhard E56 pure gold plating bath, Engelhard E59 neutral soft gold plating bath and Technic Corporation ORO-TEMP-24 gold plating bath. Non-cyanide gold plating baths may also be employed. An example of a copper plating bath is Selrex Corporation's Cu-bath, although any suitable copper plating bath may be employed.

A copper conductive layer is generally preferred over a gold conductive layer when it is anticipated that considerable soldering with low temperature solders will be done on the substrate, since the solderability of copper is better than the solderability of gold for low temperature solders. The solderability of gold, however, may be improved by first plating a nickel layer onto layers 24 and 26 and thereafter plating gold layers 28 and 30 thereon. Any suitable nickel plating bath can be used including a nickel sulfamate bath which is presently preferred. Depending upon the application, copper may be preferred over gold because its better conductivity and its lower cost. Layers 28 and 30 are generally plated to a thickness so that the conductive layer 29 and the ground plane layer 32 each total between about 3 to 25 microns in thickness, preferably from about 4 to 20μ, and more preferably 4 to 10μ.

After forming the ground plane layer 32 and the conductive layer 29 standard photoresist and etching techniques as described previously in connection with FIGS. 1-4 are employed to form the desired pattern which in this case is conductor line 34.

This electroplating technique for forming MIC substrates is especially useful when the dielectric is fused silica. Such an MIC substrate possesses a high dielectric constant and as a result may be used at high frequencies.

Figure 9:
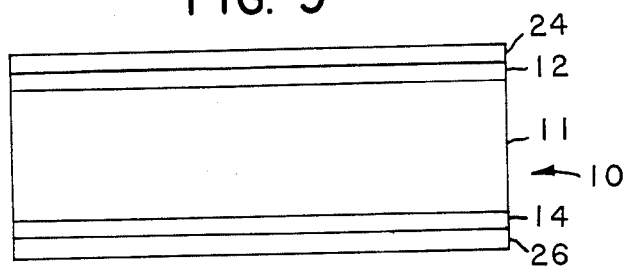
FIGS. 9–13 are sectional views showing the production of the metallized substrate of the present invention by the patternplating technique.
Figure 10:
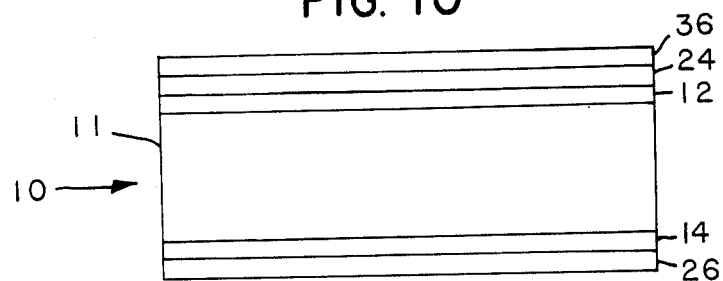
Figure 11:
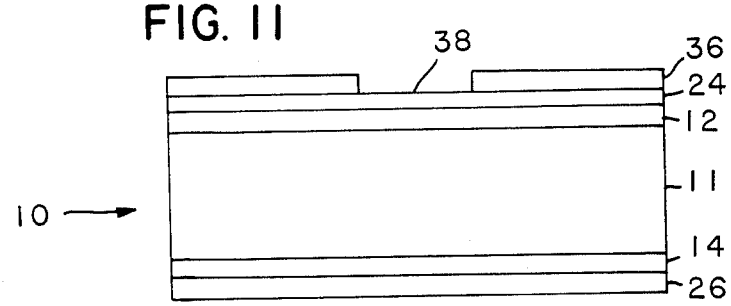
Figure 12:
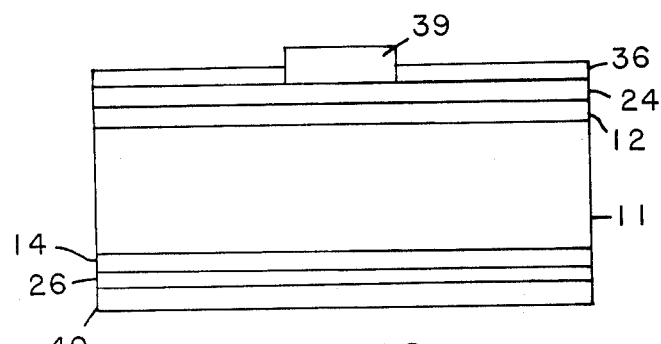
Figure 13:
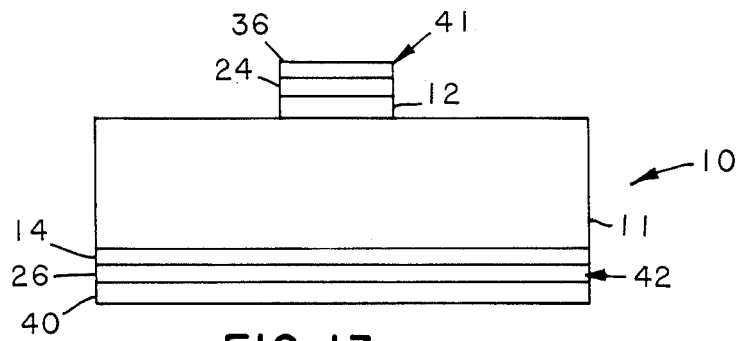

According to still another embodiment of the present invention, as shown in FIGS. 9-13, a form of electroplating, patternplating, is used to manufacture the MIC substrate. First, as shown in FIG. 9, layers 12, 14, 24 and 26 are formed as described above in connection with the description of the MIC substrate of FIGS. 5-8. Then, as shown in FIG. 10, a layer of a photoresist material 36 is applied to a layer 24. Any suitable photoresist material may be used. Thereafter, the photoresist is selectively exposed to light through a photomask, not shown, so as to define the desired pattern, and then the undesired photoresist material is washed away with a conventional developer to leave the desired pattern. Any suitable photoresist technique including a negative or positive working photoresist may be employed, although a negative working resist is presently preferred. In this particular case, the pattern is in the form of a line 38, which is then electroplated with a conductive material so as to form layer 39 (FIG. 12). The conductive material will only be electroplated onto the line portion 38 because the remaining surfaces of the top side of the substrate contain the photoresist material layer 36 which is non-conductive and thus will not accept an electroplated material. Simultaneously, the bottom side of the substrate will be built up by forming layer 40 so as to form the ground plane 42. Again, while any conductive material can be employed it is presently preferred to electroplate either gold or copper. A description of suitable plating baths is described herein with reference to discussion of FIGS. 5-8. Then, as best shown in FIG. 13, the remaining photoresist is stripped away with a conventional stripping solvent and the selective portions of layers 12 and 24 are flash etched away leaving conducting line 41.

Figure 14:
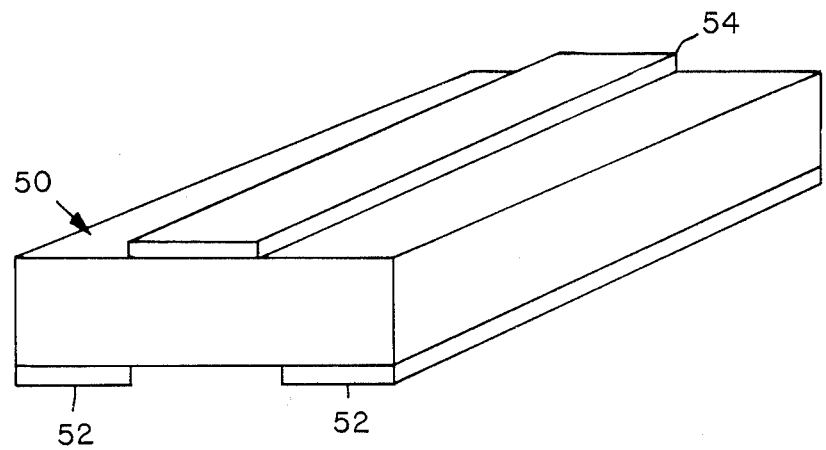
FIGS. 14–16 are perspective views of other embodiments according to the present invention.
Figure 15:
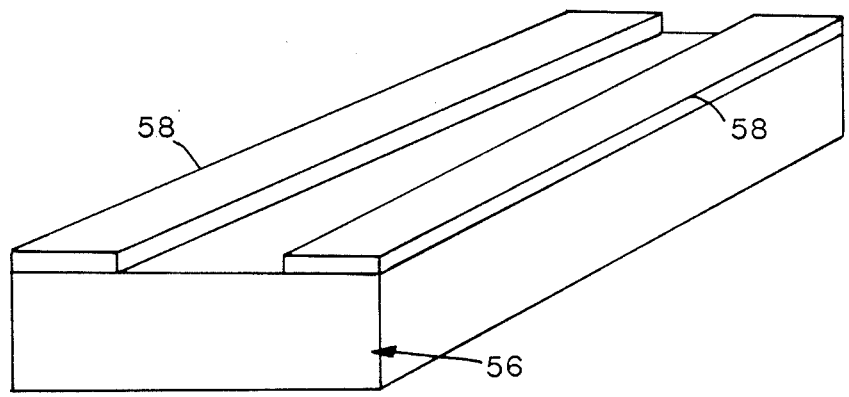
Figure 16:
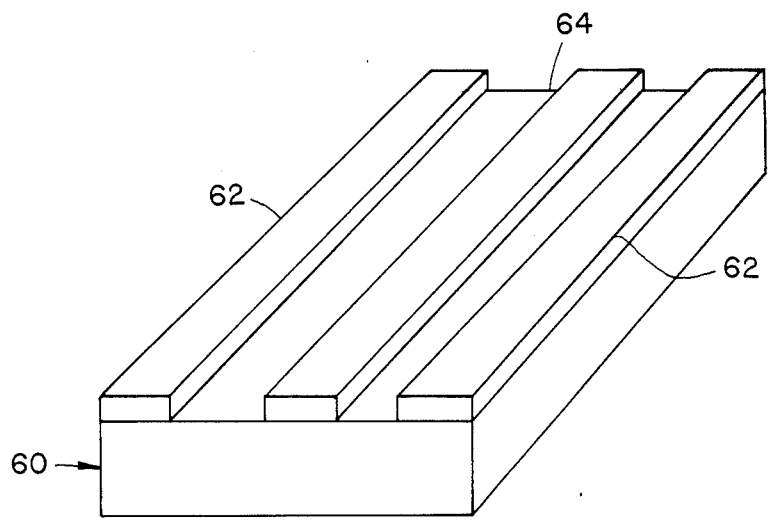

As discussed previously, the manufacturing technique of the present invention can be used to form any type of metallized substrate wherein a metal is applied to a dielectric substrate. Thus, the metallizing method of the present invention has applications in connection with multilayer dielectric substrates, hybrid circuit substrate and various other electronic components, wherein a metallized substrate is needed. Examples of other MIC substrates are shown in FIGS. 14–16. In FIG. 14, a slotted microstrip substrate 50 with the ground plane 52 is slotted beneath the conductor track 54. The effect of the slot is to reduce the line capacitance which increases its characteristic impedance. A slot line is shown in FIG. 15. As shown, electric field lines 58 run across the slot enabling the devices to be shunt mounted. Impedance increases with the slot with, consequently high impedance lines are easy to manufacture. Propagation is, however, non-TEM so that the lines are dispersive and field lines are not confined to the substrate which reduces the effect of dielectric constant. A co-planer guide 60 is shown in FIG. 16 with ground plane 62 and conducting line 64. It possesses similar properties to the slot line. These and other MIC substrates can be produced according to the process of the present invention.

The present invention will now be described with reference to the Examples.

EXAMPLE 1

Figure 17:
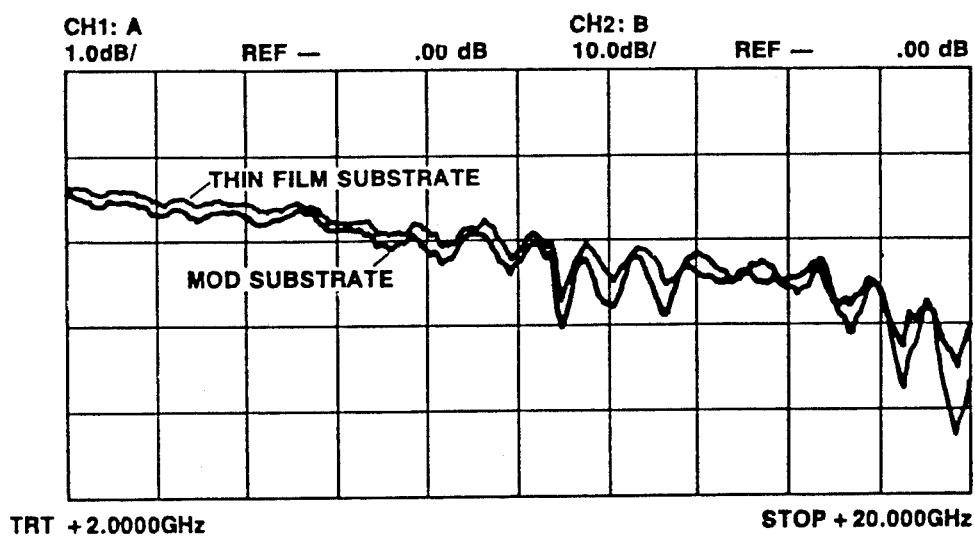
FIG. 17 is a graph comparing the performance of a substrate of the present invention with a prior art substrate.

A microstrip substrate was prepared by the screen printing technique. First, a metallo organic composition comprising 51.4 grams gold (II) t-dodecylmercaptide (18%), 0.3 grams rhodium (III)-ethylhexoate (0.05%), 0.2 grams chromium-2-ethylhexoate (0.03%), 1.0 grams vanadium-naphthenoate (0.05%), 0.2 grams antimony neodecanoate (0.042%), 0.5 grams bismuth-2-ethylhexoate (0.18%) and a medium comprising 6 grams Uformite F-200E manufactured by Reichold Chemicals (ureaformaldehyde resin), 6 grams Duraplex 12-808 manufactured by Reichold Chemicals (alkyd resin), 15 grams Engelhard HLA3535 which is composed of 59% terpineol 318, 1% red dye N-1700 and 40% Neville resin LX685-125 and 22 grams FNDP manufactured by Fitszche Dodge and Olcott (a fast non-drying plasticizer) is mixed together. It was then gelled in an oven at 130° C. for three hours to burn off some of the organics reducing the weight of the composition from 102.6 grams to 80 grams. The percentages in parenthesis after the resinate refer to the percent metal in the metallo organic composition after it is reduced down and in the form of an ink. This applies to all of the examples herein. The resulting composition was roll milled on a three roll mill into a paste suitable for screen printing. The metallo organic composition was then screen printed onto both sides of a 96% alumina dielectric substrate through a 325 stainless steel screen mesh. The thickness of both the top and bottom layers was measured to be about 0.3 microns. The substrate was then dried in an oven at 125° C. for ten minutes and then fired in a moving belt furnace for one-half hour with a peak temperature of about 850° C. for about ten minutes. The top and bottom layers on the substrate produced from the metallo organic composition were then built up by screen printing through a 325 mesh stainless steel screen a fritless gold paste, Engelhard A1644, so as to build up the metal layer to an overall thickness of about 4.0 microns. The substrate was again dried in an oven at 125° C. for about twenty minutes and then fired in a moving belt furnace for one-half hour with a peak temperature of about 850° C. for ten minutes. A photoresist material was then applied to the top surface of the substrate. The photoresist layer was then selectively exposed to light through a photomask and then the exposed photoresist material was etched away with a developer so as to define a conducting line. The insertion loss through 20 GHz of the MIC substrate of this example was measured and compared against a MIC substrate manufactured according to the thin film process. As shown in FIG. 17, the insertion losses for the substrate of this example and that of one manufactured by the thin film technique are comparable.

EXAMPLE 2

Another microstrip substrate was prepared by the screen printing technique. It was prepared according to the process described in Example 1 except that a polished alumina dielectric substrate was employed. The metallo organic composition was different and composed of 75 grams gold(II) t-dodecylmercaptide (18%), 1.5 grams rhodium(III)-ethylhexoate (1.5%), 15 grams platinum(II) chloride-i-octylthioglycolate (1.8%), 0.15 grams chromium methylsulfide (0.03%), 0.9 grams vanadium-naphthenoate (0.05%), 0.15 grams antimony neodecanoate (0.042%), 0.45 grams bismuth-2-ethylhexoate (0.18%), 1.0 grams silicon-2-ethylhexoate (0.093%). The resinates were mixed together and reduced down in a steam bath it reached a weight of 72 grams. 28 grams of a medium comprising 50.4% terpineol, 10% oil of Amarys, 12.6% asphalt gilsonite resin, 25% Uformite F-200E and 2% p-toluene sulfonic acid was then added thereto. The resulting composition was then roll milled on a three roll mill into a paste suitable for screen printing.

EXAMPLE 3

A microstrip substrate was prepared by the screen printing technique as described in Example 1, except that a fused silica dielectric substrate was employed instead of a 96% alumina dielectric substrate. In addition, the metallo organic composition was different and composed of the following: 75 grams gold(II) t-dodecylmercaptide (18%), 1.5 grams rhodium(III)-ethylhexoate (0.05%), 1.04 grams chromium methylsulfide (0.1%), 0.9 grams vanadium-naphthenoate (0.05%), 0.15 grams antimony neodecanoate (0.042%), 0.45 grams bismuth-2-ethylhexoate (0.18%), 1.0 grams silicon-2-ethylhexoate (0.093%), 3.1 grams of tin dibutyl neodecanoate which was reduced down to 72 grams as described in Example 2 to which 28 grams of medium was added. The medium was the same as disclosed in Example 2.

EXAMPLE 4

A microstrip substrate was prepared by the pattern-plating technique. First, a metallo organic composition comprising 51 grams gold(II) t-dodecylmercaptide (14.2%), 0.6 grams rhodium(III)-ethylhexoate (0.09%), 2.8 grams Al(butoxide)$_3$ (0.14%), 2.0 grams chromium-2-ethylhexoate (0.17%), 1.0 grams bismuth-2-ethylhexoate (0.24%), 1.5 grams silicon-2-ethylhexoate (0.126%), 1.0 grams Cu(neodecanoate)$_2$ (0.0959%), 2.5 grams tin dibutylneodecanoate (0.07%) and a medium comprising 15 grams of Engelhard HLA3535, 22 grams of FNDP, 6 grams Duraplex and 6 grams Uformite. It was then cooked in an oven at 130° C. for two hours to burn off some of the organics reducing the weight of the composition to 100 grams. The metallo organic composition was prepared by the same technique as described in Example 1 and screen printed by the same technique as described in Example 1 onto a polished alumina substrate. The thickness of both the top and bottom layers was measured to be about 0.3 microns. The substrate was then dried and fired as described in Example 1. Then, another layer of metallo organic material was applied to both the top and bottom surfaces. The metallo organic material comprised 33.3% gold lavender resinate (20%), 12% gold powder (Engelhard A2630), 1% firein(rhodium resinate) (0.05%), 2.0% dibutylphthalate and terpineol and 51.7% medium, the medium being the same medium as described in Example 1. The layer was applied by screen printing and dried and fired all according to the procedure set forth in Example 1. The thickness of the layer was about 0.3μ. Then, a photoresist material was applied to the top surface of the substrate. Thereafter, the photoresist layers were selectively exposed to light through a photomask so as to define the desired pattern. The unexposed portion, which in this case was in the form of a line was washed away exposing the metallo organic adhesion layer. The substrate was then electroplated with a gold conductor using Engelhard E56 pure gold plating bath. Since a portion of the surface was masked with a non-conductive photoresist material, the conductor did not plate to those portions of the surface, but only onto the portion not having the photoresist. Once the conductor line was plated up in this manner, the photoresist material was stripped away with a conventional solvent and then the remaining metallo organic layers were flashed etched leaving the conductor line pattern.

I claim:

1. A metallized substrate comprising a dielectric substrate, a metal layer produced from a metallo organic composition comprising at least one precious metal resinate in an amount of from about 4 to 25 percent, at least one film forming in an amount of from about 0.01 to 1.0 percent, at least one base metal resinate in an amount of from about 0.1 to 3 percent and a suitable medium, and a conductive metal layer thereon.

2. The metallized substrate of claim 1, wherein the conductive metal layer is applied by either screen printing or electroplating.

3. The metallized substrate of claim 2, wherein the conductive metal layer is applied by screen printing.

4. The metallized substrate of claim 3, wherein the conductive metal layer is applied by electroplating.

5. The metallized substrate of claim 1, wherein the dielectric substrate is selected from the group consisting of 99.6% alumina, polished alumina and fused silica.

6. The metallized substrate of claim 4, wherein the metallo organic composition comprises at least one precious metal resinate, at least one film forming resinate and at least one base metal resinate other than tin, bismuth or chromium.

7. The metallized substrate of claim 5, wherein the precious metal resinate is selected from the group consisting of gold, silver, platinum, palladium or mixture thereof.

8. The metallized substrate of claim 1, wherein the conductive metal layer comprises either gold or copper.

9. The metallized substrate of claim 1, wherein the metallized substrate is a microwave integrated circuit substrate.

10. The metallized substrate of claim 9, wherein the microwave integrated circuit substrate contains a microstrip transmission line.

11. A process for producing a metallized substrate comprising forming a first adhesion promoting layer by applying a metallo organic composition to a dielectric substrate and thereafter forming a conductive layer thereon said metallo organic composition comprising at least one precious metal resinate in an amount of from about 4 to 25 percent, at least one film forming in an amount of from about 0.01 to 1.0 percent, at least one base metal resinate in an amount of from about 0.1 to 3 percent and a suitable medium.

12. A process according to claim 11, wherein a first adhesion promoting layer is formed by screen printing and the conductive layer is formed by electroplating.

13. A process according to claim 11, wherein the first adhesion promoting layer and the conductive layer are both formed by screen printing.

14. A process according to claim 11, wherein the metallized substrate is a microwave integrated circuit substrate and conducting line patterns and ground plane are formed thereon by means of photoresist and etching techniques.

15. A process according to claim 11, wherein a second adhesion promoting layer is formed on the first adhesion promoting layer from a metallo organic composition prior to the formation of the conductive layer.

16. A process according to claim 11, wherein the dielectric substrate is selected from the group consisting of 99.6% alumina, polished alumina and fused silica.

17. A process according to claim 15, wherein the metallo organic composition used to form the second adhesion promoting layer comprises at least one precious metal resinate and at least one film forming resinate.

18. The process according to claim 11, wherein the conductive layer is formed by electroplating the metallo organic composition wherein the at least one base metal resinate is neither tin, bismuth, or chromium.

19. The process according to claim 11, wherein the conductive layer is formed of either gold or copper.

* * * * *